United States Patent
Keiter

[19]

[11] 3,973,204
[45] Aug. 3, 1976

[54] YIG TUNED MIXER

[75] Inventor: Richard C. Keiter, Healdsburg, Calif.

[73] Assignee: Hewlett-Packard Company, Palo Alto, Calif.

[22] Filed: Feb. 25, 1975

[21] Appl. No.: 552,912

[52] U.S. Cl. .............................. 325/448; 325/439
[51] Int. Cl.² .............................................. H04B 1/26
[58] Field of Search ........... 325/442, 439, 448, 446, 325/451, 453, 438, 437, 436, 430; 329/116; 331/96; 321/69 W, 69 NL

[56] References Cited
UNITED STATES PATENTS

| | | | |
|---|---|---|---|
| 3,562,651 | 2/1971 | Hoover et al. | 325/448 |
| 3,839,677 | 10/1974 | Sedin | 325/439 |

Primary Examiner—Robert L. Griffin
Assistant Examiner—Robert Hearn
Attorney, Agent, or Firm—Patrick J. Barrett

[57] ABSTRACT

A microwave mixer is integrated with an yttrium-iron-garnet (YIG) tuning element to provide a YIG tuned heterodyne conveter or mixer. An input signal is provided to the YIG tuning element by an input coupling loop and local oscillator power is provided to an output coupling loop. A mixing diode is connected in series with the output coupling loop close to the YIG tuning element, and the mixing products appear on the output coupling loop. The output coupling loop is connected to a circuit which separates the local oscillator input signal from the intermediate frequency output signal.

5 Claims, 5 Drawing Figures

YIG TUNED MIXER

BACKGROUND OF THE INVENTION

Yttrium-iron-garnet tuning elements are commonly used in electronically tunable band pass filters employed in microwave devices. In broad band microwave instruments such as receivers and spectrum analyzers these tunable band pass filters are often used in or before RF input circuits as tunable preselectors to insure that only a narrow band of frequencies is being supplied to the instrument input at any one time. This preselection is particularly useful in a broad band heterodyne instrument since it helps eliminate confusing spurious intermediate frequency (IF) signals due to the mixing of the local oscillator signal with input signals other than the desired one.

Prior art preselectors are housed in separate enclosures that are connected to subsequent circuit devices, such as mixers, by a length of transmission line. These prior art systems, however, suffer from a lack of flatness, i.e., there are variations in the signal level over the tuning range of the instrument. The variations in signal level arise because the YIG element reflects signals that are outside of its pass band as well as a small portion of the signals it is designed to pass. A mixer likewise reflects some of the signals that are incident upon it. The reflected signals present in the transmission line coupling a preselector with a mixer add or subtract to form standing waves, depending upon the frequencies of the signals present and the length of the line. The usual prior art solution to such variations in flatness is to provide some attenuation in the transmission line to absorb some of the reflected signals. This additional attenuation however increases the system noise figure undesirably.

SUMMARY OF THE INVENTION

According to a preferred embodiment of the present invention a YIG filter comprising at least one YIG sphere with input and output coupling loops is provided with a mixing diode in series with the output coupling loop. Input signals are supplied to the input coupling loop in the conventional manner, and local oscillator power is supplied to the mixing diode through a directional coupler and a transmission line connected to the output coupling loop. The IF signal resulting from the mixing of the local oscillator signal and the input signal also appears on the output coupling loop and is carried from the mixer over the same transmission line carrying the local oscillator power. A band pass filter tuned to the intermediate frequency signal is connected to the transmission line to pass only the IF signal to an IF output.

DESCRIPTION OF THE PREFERRED EMBODIMENT

Figure 1:
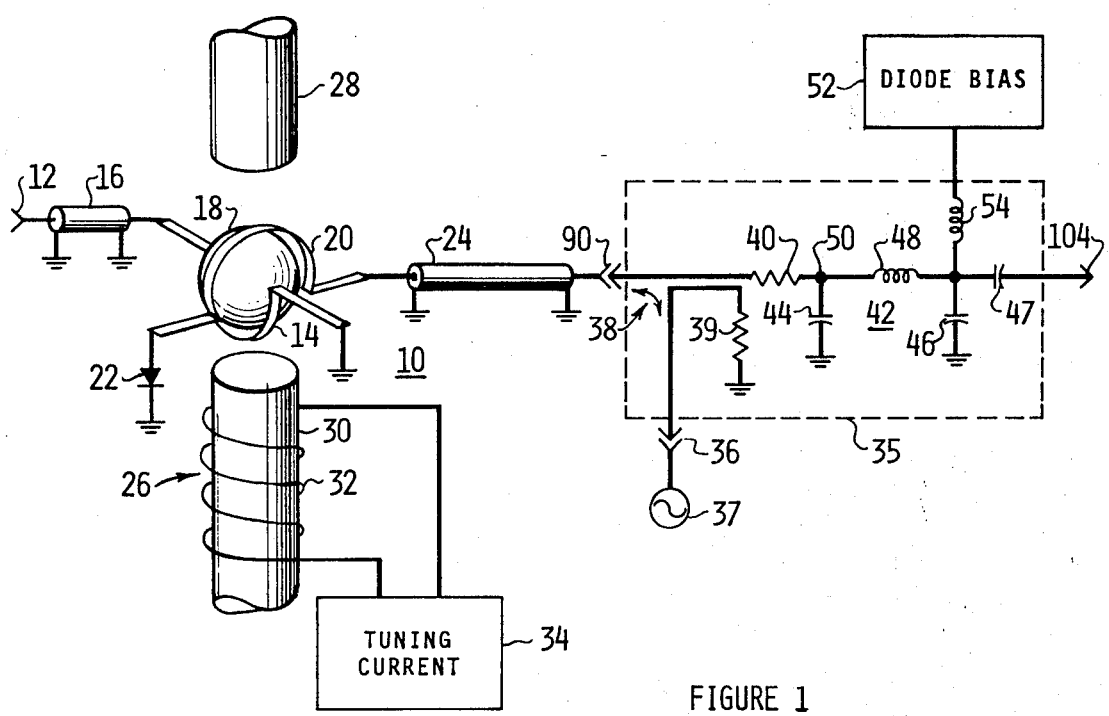
FIG. 1 shows a schematic diagram of a preferred embodiment of the present invention.

FIG. 1 shows a schematic diagram of a YIG tuned mixer 10 having an input 12 connected to an input coupling loop 14 by a transmission line 16. Coupling loop 14 couples signals on input 12 to a YIG sphere 18 and signals are coupled out of YIG sphere 18 by a coupling loop 20. A mixing diode 22 is connected in series with coupling loop 20 which in turn is connected to a transmission line 24 such as coax, for example. Diode 22 is preferably a hot carrier diode though other kinds of mixing devices may be used.

The center frequency of the pass band of the YIG filter is determined by the magnetic field produced by an electromagnet 26 which includes pole pieces 28 and 30 and a magnet coil 32. Tuning current for the YIG filter is supplied to the magnet coil 32 by a tuning current supply 34.

Transmission line 24 is connected to a circuit 35 through a connector 90 which, in turn, is connected to a first arm of a directional coupler 38 in circuit 35. Local oscillator power is supplied to circuit 35 by a local oscillator 37 through a LO input 36 connected to a second arm of the directional coupler 38 which is terminated in a resistor 39. Local oscillator power flows through the directional coupler 38 and transmission line 24 into coupling loop 20 and diode 22. In diode 22 the input signal, which has been coupled through the YIG sphere, mixes with the local oscillator signal producing various mixing products. The local oscillator signal does not pass through the YIG filter to input 12 since the YIG filter is tuned to a frequency different from that of the local oscillator.

In order to minimize standing waves between YIG sphere 18 and diode 22, it is preferable to make the distance between the diode and the YIG less than one eighth of a wavelength at the highest frequency input signal that will be used. Thus in a mixer for input signals up to 18 GHz, the diode to YIG sphere spacing would preferably be less than 2 mm. The physical relationship of diode 22 to the YIG sphere and coupling loop are shown in greater detail in subsequent figures.

As previously mentioned, the mixing products or signals resulting from the combination of the input signal and the local oscillator signal are also present on coupling loop 20 and threfore on transmission line 24. These signals flow straight through directional coupler 38 to a resistor 40 and a band pass filter network 42 comprising shunt capacitors 44 and 46 and a series inductor 48. The resistance of resistor 40 is chosen to be the same as the characteristic impedance of the transmission line 24, typically 5 ohms.

In the illustrated embodiment the mixer is designed for an input signal in the range of 1.5 to 18 GHz, a local oscillator signal in the range of 1.8 to 4.3 GHz and an intermediate frequency of approximately 320 MHz. It will be appreciated by those skilled in the art, however, that the mixer can be used in other frequency ranges. The intermediate frequency is usually chosen significantly lower than the input or local oscillator signal frequencies so that signals coming through transmission line 24, other than the intermediate frequency signal, are likely to be very much higher than the intermediate frequency. The value of capacitor 44 is selected so it appears to be a short at frequencies above the intermediate frequency so that higher frequency signals are absorbed by resistor 40. At the intermediate frequency inductor 48 resonates with capacitors 44 and 46 to form a band pass filter.

At the intermediate frequency diode 22 appears to be high impedance, e.g. about 150 ohms, compared with the characteristic impedance of transmission line 24, typically 50 ohms. The length of transmission line 24 is selected to make the separation between diode 22 and node 50 ½ wavelength (or an integral multiple of ½ wavelength) at the intermediate frequency. Band pass filter 42 is designed to transform the relatively high impedance of the diode at the intermediate frequency down to the load impedance at connector 104, typically 50 ohms. This impedance change produces a standing wave pattern on transmission line 24 and since the transmission line is ½ wavelength long, there is a current minimum and a voltage maximum at node 50. Minimizing the current at this point minimizes the IF signal power loss through resistor 40.

When a hot carrier diode is used for diode 22, bias voltage must usually be supplied to the diode. Diode bias can be conveniently supplied through coupling loop 20, transmission line 24, and circuit 35 by connecting the output of filter 42 to a diode bias supply 52 through an inductor 54. The inductor 54 attenuates signals at the IF frequency to isolate the diode bias supply from RF signals.

Figure 2:
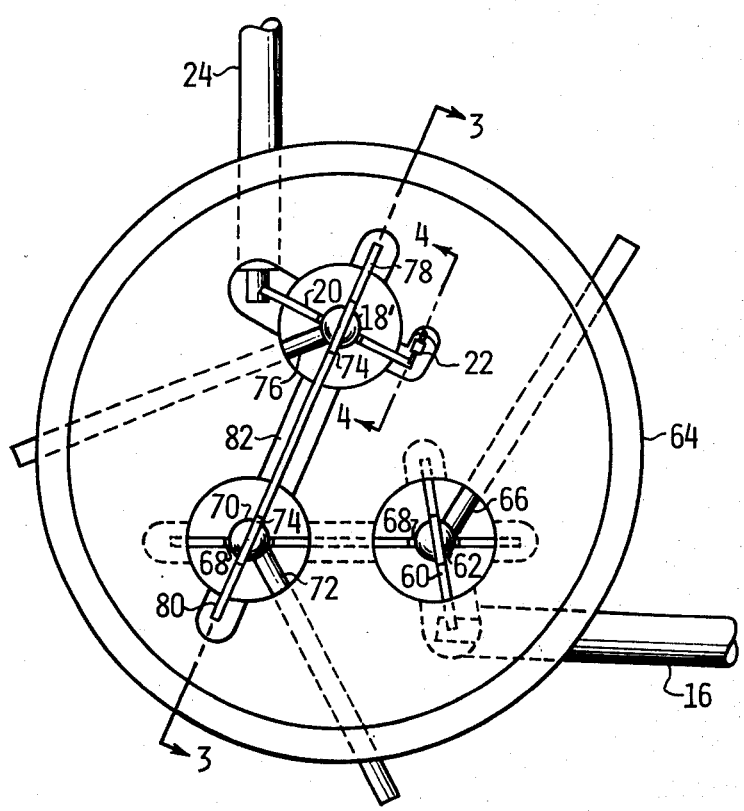
FIG. 2 shows a top view of a YIG filter combined with a microwave mixer.

FIG. 2 shows an enlarged top view of a physical embodiment of a YIG tuned mixer. In this figure the YIG filter portion is shown as including three YIG spheres instead of a single sphere as in FIG. 1. Although only one YIG sphere is necessary to construct a device according to the present invention, a more selective filter may be achieved by using additional YIG spheres. Input transmission line 16 is shown connected to a first coupling loop 60 around a first YIG sphere 62. The YIG sphere is mounted in a body 64 on a mounting rod 66 made, for example, of beryllium oxide so that it is electrically insulating but thermally conductive. The mounting rod 66 is held firmly in place in an appropriate hole in body 64.

A second coupling loop 68 couples signals from YIG sphere 62 to YIG sphere 70 in a second cavity in body 64. Yig sphere 70 is mounted in body 64 on a mounting rod 72. Signals from YIG sphere 70 are, in turn, coupled by a coupling loop 74 to the third YIG sphere 18' mounted on a mounting rod 76 in a third cavity in body 64. As shown in FIG. 1 the second coupling loop 20 around sphere 18' connects the center conductor of coaxial transmission line 24 to diode 22 which is mounted adjacent to the cavity containing YIG sphere 18'.

Figure 3:
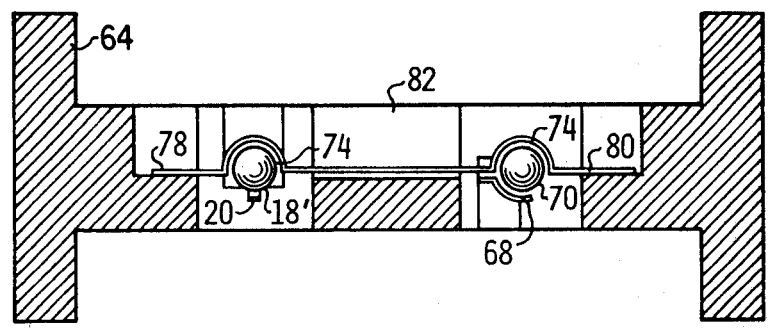
FIG. 3 shows a sectional view of the device in FIG. 2.

FIG. 3 shows a cross-sectional view of the device in FIG. 2 illustrating the relationship of two of the YIG spheres and the coupling loops surrounding them. Coupling loop 74, for example, is grounded at each end 78 and 80 by attachment to body 64 and passes through a passageway 82 between the cavities containing YIG spheres 18' and 70.

Figure 4:
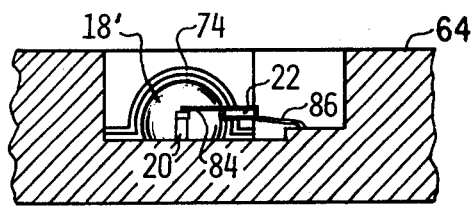
FIG. 4 shows a partial sectional view of the device in FIG. 2.

FIG. 4 is a cross-sectional view showing the details of the mounting of diode 22 in body 64. The diode is illustrated as a beam lead device with one of the beam leads 84 welded to coupling loop 20 and the other lead 86 attached directly to body 64.

Figure 5:
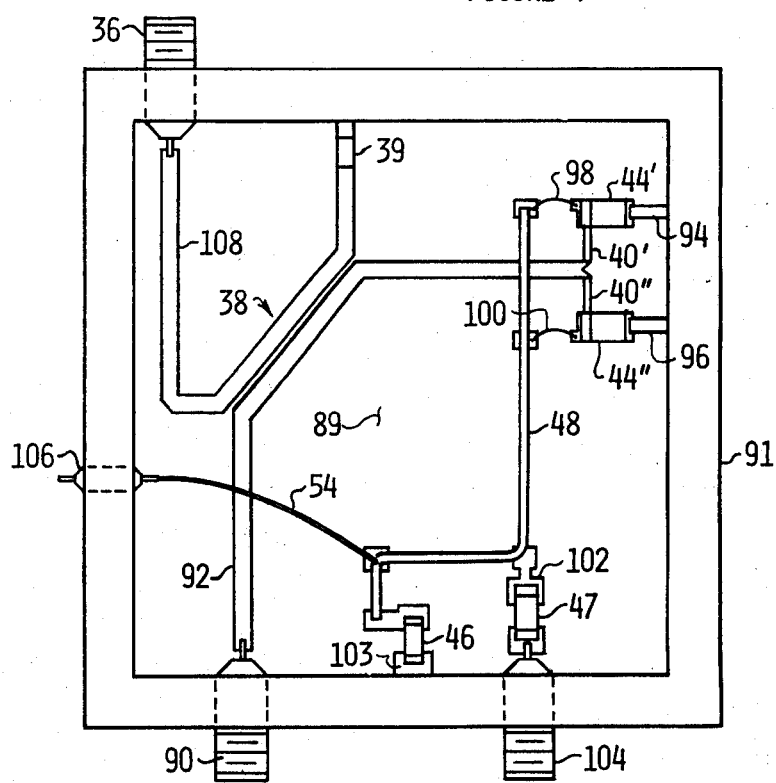
FIG. 5 shows a top view of a directional coupler and a band pass filter.

FIG. 5 shows an enlarged top view of a physical embodiment of circuit 35 shown schematically in FIG. 1. The circuit is built on a microcircuit substrate 89 which is housed in a housing 91 and contains various conductive and resistive depositions. A connector 90 for connection to transmission line 24 is connected to a strip transmission line 92, a portion of which forms one arm of directional coupler 38. Strip line 92 is terminated in two resistive deposits 40' and 40" which, taken in parallel, comprise resistor 40. These resistive depositions are connected, in turn, to capacitors 44' and 44" respectively. These capacitors may be barium titanate multilayer capacitors that are grounded by conductive straps 94 and 96 respectively to housing 91.

Inductor 48 is formed by a wire connected to capacitors 44' and 44" via bonding leads 98 and 100. Inductor 48 is also connected to a D.C. blocking capacitor 47 on a mounting pad 102. Capacitor 47 is connected to a connector 104 which forms the intermediate frequency signal output. Another portion of the wire forming inductor 48 connects to capacitor 46 which is grounded to housing 91 by a grounding strap 103. Inductor 54 is formed by a fine wire connected to inductor 48 and a feedthrough 106 which receives the diode bias voltage from voltage supply 52. The second arm of directional coupler 38 is formed by a second strip transmission line 108 connected at one end to a connector 36 which receives the local oscillator signal and at the other end to a terminating resistor 39 which is grounded to housing 91.

I claim:
1. A mixer comprising:
a housing;
a yttrium-iron-garnet tuning element mounted in the housing;
input means in the housing for coupling an input signal to the tuning element;
coupling means in the housing for coupling signals from the tuning element;
a transmission line, having a characteristic impedance connected to the coupling means;
a nonlinear mixing element mounted in the housing in the immediate proximity of the tuning element and connected in series with the coupling means; and
a coupling network connected to the coupling means by the transmission line for supplying a drive signal to and receiving an intermediate frequency signal from the mixing element, the coupling network including a series connected resistor having a resistance substantially equal to the characteristic impedance of the transmission line for absorbing undesired reflected signals.

2. A mixer as in claim 1 wherein:
the mixing element comprises a semiconductor diode; and
the coupling means comprises a conductive loop about a portion of the periphery of the tuning element, having one end fastened to the diode.

3. A mixer as in claim 2 wherein the separation between the diode and the tuning element is less than one eighth of a wavelength at the frequency of the highest frequency input signal.

4. A mixer as in claim 2 wherein the coupling network comprises:
a directional coupler having a first port connected to a second end of the conductive loop, having a second port for receiving a drive signal, and having a third port;
a band pass filter tuned to pass an intermediate frequency signal; and
the series connected resistor connected between the direction coupler third port and the band pass filter.

5. A mixer as in claim 4 wherein the distance between the diode and the junction between the resistor and the band pass filter is one half of a wavelength at the intermediate frequency, and the input and output impedances of the band pass filter are unequal at the intermediate frequency.

* * * * *